(12) United States Patent
Huang

(10) Patent No.: US 8,372,683 B2
(45) Date of Patent: Feb. 12, 2013

(54) RTP HEATING SYSTEM AND METHOD

(75) Inventor: Shiezen Steven Huang, Redondo Beach, CA (US)

(73) Assignee: ADPV Technology Limited, Apia (WS)

( * ) Notice: Subject to any disclaimer, the term of this patent is extended or adjusted under 35 U.S.C. 154(b) by 0 days.

(21) Appl. No.: 13/004,654

(22) Filed: Jan. 11, 2011

(65) Prior Publication Data

US 2012/0003774 A1      Jan. 5, 2012

(30) Foreign Application Priority Data

Jul. 2, 2010   (TW) ............................... 99121872 A

(51) Int. Cl.
H01L 31/18       (2006.01)

(52) U.S. Cl. ............ 438/72; 438/93; 438/796; 438/799; 136/262; 136/264; 136/265; 219/494

(58) Field of Classification Search .................... 438/64, 438/84; 250/208.1–208.6, 370.1, 370.09, 250/370.15, 552, 553; 257/467–470
See application file for complete search history.

(56) References Cited

U.S. PATENT DOCUMENTS

| | | | |
|---|---|---|---|
| 2007/0215196 A1* | 9/2007 | Nakashima et al. | 136/243 |
| 2008/0305247 A1 | 12/2008 | Von Klopmann et al. | |
| 2009/0305455 A1 | 12/2009 | Leidholm et al. | |
| 2011/0136293 A1* | 6/2011 | Aksu et al. | 438/84 |
| 2011/0139246 A1* | 6/2011 | Drayton | 136/260 |
| 2011/0295539 A1* | 12/2011 | Tsai et al. | 702/99 |

FOREIGN PATENT DOCUMENTS

DE         19936081         2/2001

* cited by examiner

*Primary Examiner* — Olik Chaudhuri
*Assistant Examiner* — Wilner Jean Baptiste
(74) *Attorney, Agent, or Firm* — Muncy, Geissler, Olds & Lowe, PLLC

(57) ABSTRACT

An RTP heating system and an RTP heating method, which can heat a photovoltaic-device intermediate product having a glass substrate, a Mo layer, and a light absorption layer in formation. The RTP heating system is composed of a chamber; a support member located in the chamber; a heating element mounted in the chamber for emitting infrared rays for heating; and a plurality of temperature sensors and a temperature control device for sensing and controlling thermal sources from the heating element and the support member. The infrared rays can be mostly reflected off the Mo layer to apply less direct heating to the glass substrate. Accordingly, the upper and lower surfaces of the photovoltaic-device intermediate product can be heated under different temperatures separately to prevent the glass substrate below the photovoltaic-device intermediate product from softening and deformation and to allow production of the light absorption layer on the Mo layer.

14 Claims, 4 Drawing Sheets

RTP HEATING SYSTEM AND METHOD

BACKGROUND OF THE INVENTION

1. Field of the Invention

The present invention relates generally to manufacturing technology of photovoltaic devices, and more particularly, to a rapid temperature process (RTP) heating system and an RTP heating method.

2. Description of the Related Art

The existing photovoltaic devices are usually made by that a Mo layer is disposed on a glass substrate and a light absorption layer, e.g. copper indium gallium selenide (CIGS) layer or copper indium selenide (CIS) layer, is produced on the Mo layer. When it is intended to produce the light absorption layer, the temperature needs to be heightened up to 500° C. and higher, and then the light absorption layer can be formed on the Mo layer by sputtering, vapor deposition, electroplating, or inkjet.

In the process of production of the above-mentioned light absorption layer, the method of heightening the temperature includes the popular RTP is to heat photovoltaic devices by a thermal source located above the photovoltaic devices. The thermal source can be a resistance-type heating wire or an infrared heater for heating the upper surface of the photovoltaic devices.

In the Paragraph [0013] of the specification of the U.S. Pat. Pub. No. 2008/0305247, it mentioned that German Pat. No. 19936081A1 disclosed a conventional RTP for manufacturing a CIS or CIGS layer.

U.S. Pat. Pub. No, 2009/0305455 disclosed an RTP which is to heat the upper and lower surfaces of the photovoltaic devices by an infrared lamp under the temperature of 200-600° C. However, the photovoltaic devices are made of aluminum rather than glass.

When the light absorption layer is manufactured by the RTP, if the substrate is made of glass, there will be a problem. For example, when the light absorption (CIGS) layer is manufactured, the optimal temperature is 500° C. and higher and the deformation temperature of the glass is 510° C. or so, such that the glass substrate below the CIGS layer will be softened for deformation and the whole photovoltaic devices will become unusable due to such deformation. Perhaps, that may be why the substrate is made of aluminum in the U.S. Pat. Pub. No, 2009/0305455.

As can be seen from the above, in the existing temperature control technology, it is very difficult so far to integrate the manufacturing temperature (500° C. and higher) of the light absorption layer and the deformation temperature (510° C.) of the glass on the glass substrate to allow the light absorption layer to be manufactured on the glass.

SUMMARY OF THE INVENTION

The primary objective of the present invention is to provide an RTP heating system, which can apply heating of different temperatures to the upper and lower surfaces of the photovoltaic devices having the glass substrate to allow the upper surface to meet the requirement for manufacturing temperature of the light absorption layer and to prevent the heat of the lower surface from softening and deforming the glass substrate in such a way that the light absorption layer can be manufactured on the glass substrate.

The secondary objective of the present invention is to provide an RTP heating method, which can manufacture the light absorption layer on the glass substrate without softening and deforming the glass substrate.

The foregoing objectives of the present invention are attained by the RTP heating system, which can heat a photovoltaic-device intermediate product having a glass substrate, a Mo layer coated onto the glass substrate, and a light absorption layer in formation. The RTP heating system is composed of a chamber, a support member, at least one heating element, a plurality of temperature sensors, and a temperature control device. The chamber can accommodate a photovoltaic-device intermediate product therein. The support member is located below the chamber for supporting and heating the photovoltaic-device intermediate product. The at least heating element is mounted in the upper side of the chamber for emitting infrared rays to heat the upper surface of the photovoltaic-device intermediate product. The infrared rays emitted by the heating element are each limited to a predetermined wavelength and thus can be mostly reflected off the Mo layer to apply less direct heating to the glass substrate and to apply more direct heating to the light absorption layer in formation. The temperature sensors are mounted inside the chamber for sensing the temperature of the upper and lower surfaces of the photovoltaic-device intermediate product. The temperature control device is connected with the temperature sensors, the heating element, and the support member for controlling heat sources emitted from the element and through the support member.

The foregoing objectives of the present invention are attained by the RTP heating method, which is to heat a photovoltaic-device intermediate product having a glass substrate and a Mo layer coated onto the glass substrate. The RTP heating method includes the steps of placing the photovoltaic-device intermediate product on a support member, then heating an upper surface of the photovoltaic-device intermediate product by a heating element, and finally heating a lower surface of the photovoltaic-device intermediate product through the support member. The heating element can emit infrared rays, each of which is limited to a predetermined wavelength, to heat the upper surface of the photovoltaic-device intermediate product in such a way that most of the heat is reflected by the Mo layer to apply less direct heating to the glass substrate and to apply more direct heating to the light absorption layer. In this way, the heating degree can be controlled to make the temperature of the upper surface of the photovoltaic-device intermediate product be higher than deformation temperature of the glass substrate and to make the temperature of the lower surface of the photovoltaic-device intermediate product be lower than the deformation temperature of the glass substrate. Besides, the upper and lower surfaces of the photovoltaic-device intermediate product can be heated under different temperatures separately to prevent the glass substrate below the photovoltaic-device intermediate product from softening and deformation and to allow production of the light absorption layer on the Mo layer.

DETAILED DESCRIPTION OF PREFERRED EMBODIMENTS

Figure 1:
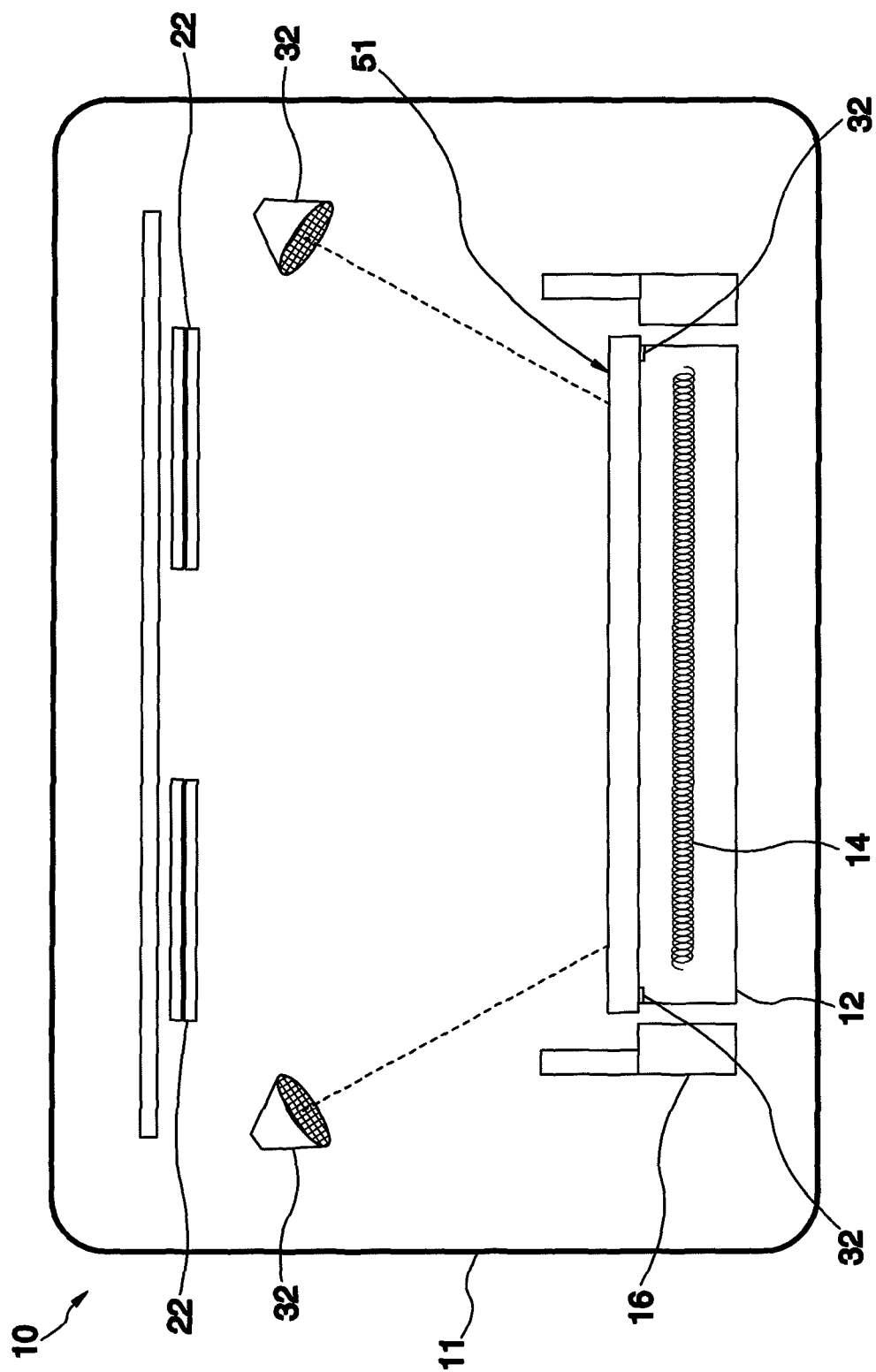
FIG. 1 is a structural schematic view of first and second preferred embodiments of the present invention.
Figure 2:
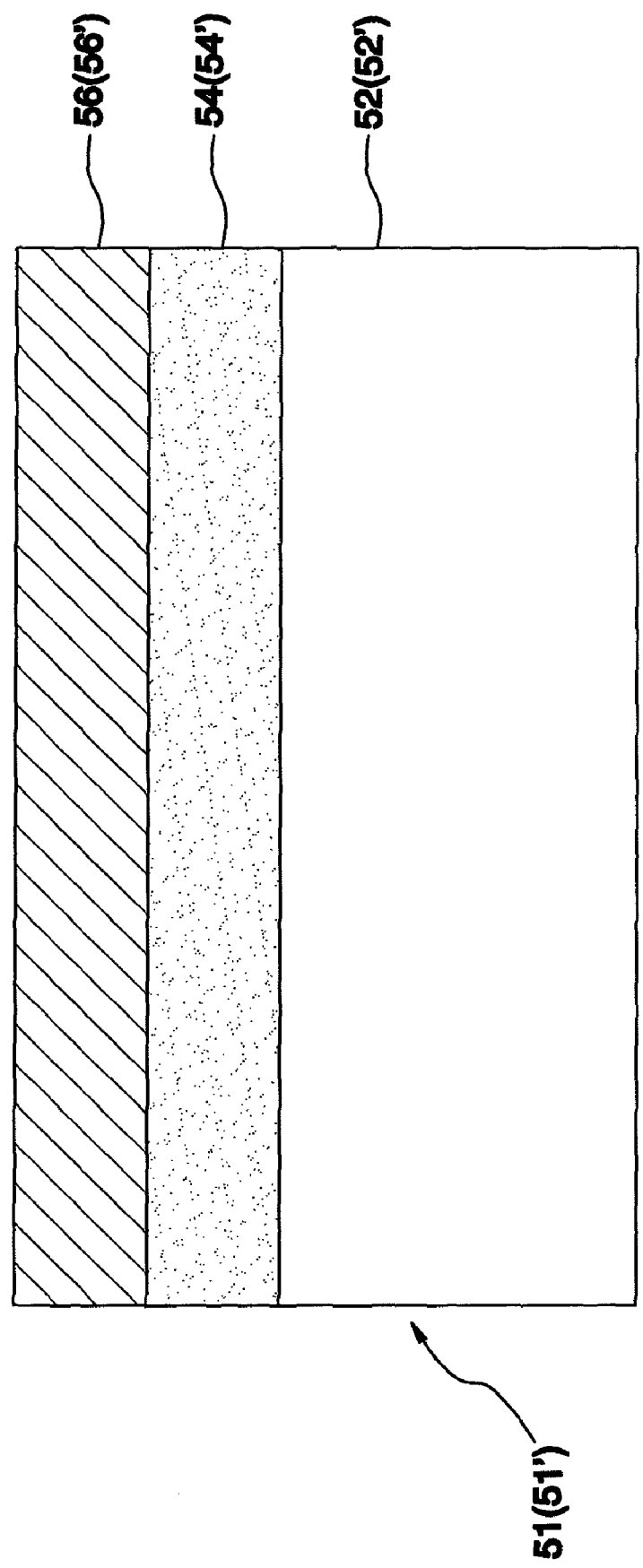
FIG. 2 is a side view of the first and third preferred embodiments of the present invention.
Figure 3:
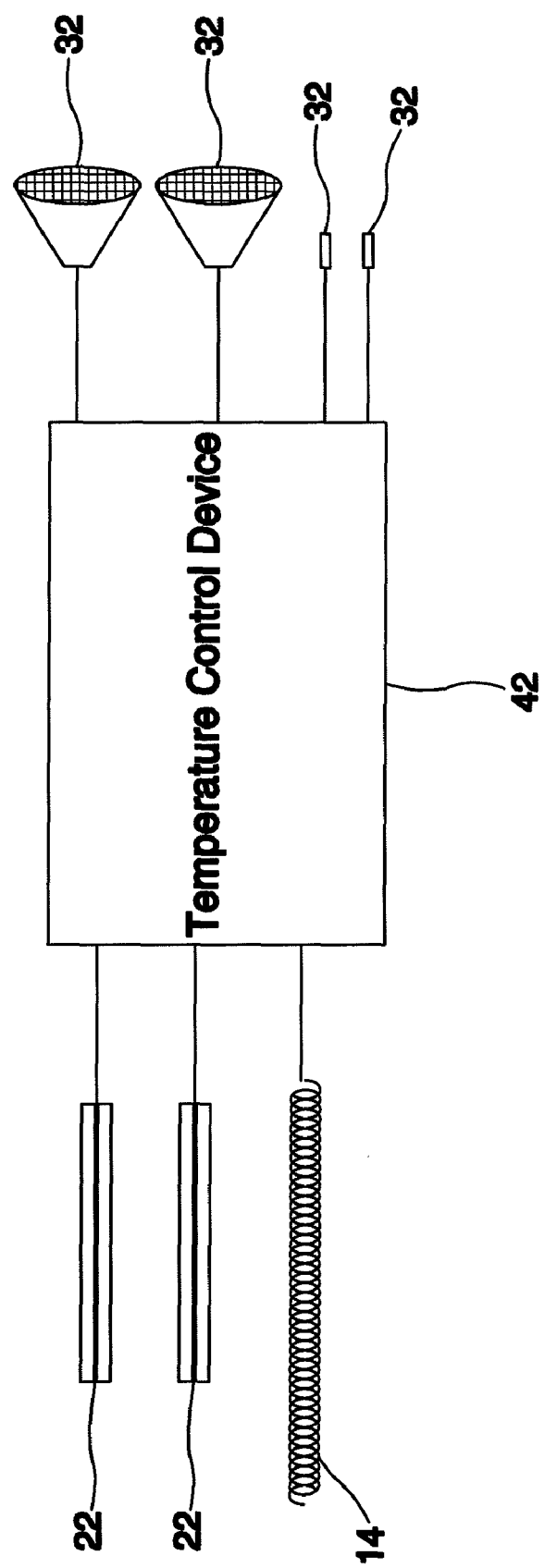
FIG. 3 is a schematic view of circuitry of the first and third preferred embodiment of the present invention.

Referring to FIGS. 1-3, an RTP heating system 10 constructed according to a first preferred embodiment of the present invention for heating a photovoltaic-device intermediate product 51, which includes a glass substrate 52, a Mo layer 54 coated on the glass substrate 52, and a light absorption layer 56 in formation, is composed of a chamber 11, a support member 12, a plurality of heating elements 22, a plurality of temperature sensors 32, and a temperature control device 42. The detailed descriptions and operations of these elements as well as their interrelation are recited in the respective paragraphs as follows.

The chamber 11 can accommodate the photovoltaic-device intermediate product 51 therein. The support member 12 has good thermal conductivity and high specific heat and is located in a lower side of the chamber 11 for supporting the photovoltaic-device intermediate product 51 and heating its upper surface, i.e. the upper surface of the glass substrate 52. In this embodiment, the support member 12 includes a lower thermal source 14 for heating the lower surface of the glass substrate 52. Besides, an external surface of the support member 12 falls within the lower surface of the photovoltaic-device intermediate product 51. The lower thermal source 14 can be a heating wire, an infrared lamp, and so on, and it is a heating wire in this embodiment, as shown in FIG. 1. The support member 12 in this embodiment, for example, has specific heat more than 250 J/Kg.° C., thermal conductivity more than 1.5 W/m° C., and coefficient of thermal expansion less than $1.2 \times 10^{-7}$/° C. at 30-750° C.

The support member 12 further includes a strut 16 of low thermal conductivity for covering a periphery thereof.

The heating elements 22 are infrared heaters mounted in the upper side of the chamber 11 for emitting infrared rays downwardly to heat the upper surface of the photovoltaic-device intermediate product 51, i.e. the light absorption layer 56 in formation on the Mo layer 54. The infrared rays emitted by the heating elements 22 are each limited to a predetermined wavelength to be mostly reflected by the Mo layer 54 to apply less direct heating to the glass substrate 52 and to apply more direct heating to the light absorption layer 56 in formation. Each of the infrared rays has a wavelength of 3500-4500 Å, and the reflected part of the infrared rays by the Mo layer 54 is more than 80%. The support member 12 is covered by the strut 16 to avoid irradiation of the infrared rays.

The temperature sensors 32 are mounted in the chamber 11 for sensing the temperatures of the upper and lower surfaces of the photovoltaic-device intermediate product 51.

The temperature control device 42 is connected with the temperature sensors 32, the heating elements 33, and the lower thermal source 14 of the support member 12 for controlling the thermal source emitted by the heating element 22 and through the support 12.

When it is intended to manufacture the light absorption layer 56 on the Mo layer 54, it is necessary to heighten the temperature. When the heating proceeds, the heating elements 22 and the lower thermal source 14 can be operated to heat the upper and lower surfaces of the photovoltaic-device intermediate product 51. Because most of the infrared rays of the heating elements 22 can reflect off the Mo layer, the glass substrate 52 below the Mo layer 54 is less directly heated. However, to avoid too much difference between the temperature of the light absorption layer 56 and that of the glass substrate 52, the lower thermal source 14 must be operated to heat the glass substrate 52 to heighten the temperature of the glass substrate 52. When the heating proceeds, the temperature control device 42 is operated to control and make the temperature of the upper surface of the photovoltaic-device intermediate product 51 be higher than that of the lower surface thereof. For example, the temperature of the upper surface is 500° C. and higher, and the temperature of the lower surface is 425° C. and higher. In this way, the temperature of the upper surface is sufficient for producing the light absorption layer 56, e.g. CIGS layer, and the temperature of the lower surface is lower than 510° C., such that the glass substrate 52 will not be softened and deformed.

In addition, the low thermal conductivity of the strut 16 can isolate the thermal energy emitted by the heating elements 22 from the strut 16 to prevent the thermal energy from directly heating the support member 12, such that the temperature of the support member 12 can be simply controlled without being interfered by the heating elements 22.

Furthermore, after the support member 12 is heated up to the required temperature, the lower thermal source 14 can be stopped from heating the support member 12, and the good thermal conductivity of the support member 12 provides thermal dissipation instead. High specific heat can result in less variation of the temperature to prevent the temperature of the support member 12 from rising subject to that of the glass substrate 52 in such a way that the lower surface of the glass substrate 52 can be thermally dissipated through the support member 12, thus resulting in that the temperature of the glass substrate 52 is not higher than the deformation temperature.

Referring to FIG. 1 again, an RTP heating method in accordance with a second preferred embodiment of the present invention for heating a photovoltaic-device intermediate product 51 having a glass substrate 52, a Mo layer 54 coated on the glass substrate 52, and a light absorption layer 56 in formation includes the following steps.

a) Put the photovoltaic-device intermediate product 51 on a support member 12.

b) Heat an upper surface (i.e. the light absorption layer on the Mo layer 54 in formation) of the photovoltaic-device intermediate product 51 by a heating element 22 and then heat a lower surface (i.e. the lower surface of the glass substrate 52) of the photovoltaic-device intermediate product 51 through the support member 12. The heating element 22 can generate infrared rays to heat the upper surface of the photovoltaic-device intermediate product 51. Each of the infrared rays is limited to a predetermined wavelength of 3500-4500 Å, such that most of the infrared rays can be reflected off the Mo layer 54 to decrease direct heating applied to the glass substrate 52 and to mainly heat the light absorption layer 56 in formation. In this way, the heating degree can be controlled to allow the temperature of the upper surface of the photovoltaic-device intermediate product 51 to be higher than the deformation temperature of the glass substrate 52 and to allow the temperature of the lower surface of the photovoltaic-device intermediate product 51 to be lower than the deformation temperature of the glass substrate 52. In this embodiment, in the process of the heating, the photovoltaic-device intermediate product 51 is heated up to 500° C. and higher and its lower surface is heated up to 425° C. and higher.

The heating method of the second embodiment takes advantages of the characteristic that the Mo layer 54 can reflect the infrared rays to isolate and prevent most of the infrared rays from directly heating the glass substrate 52 to further heat the upper and lower surfaces of the photovoltaic-device intermediate product 51 separately.

Figure 4:
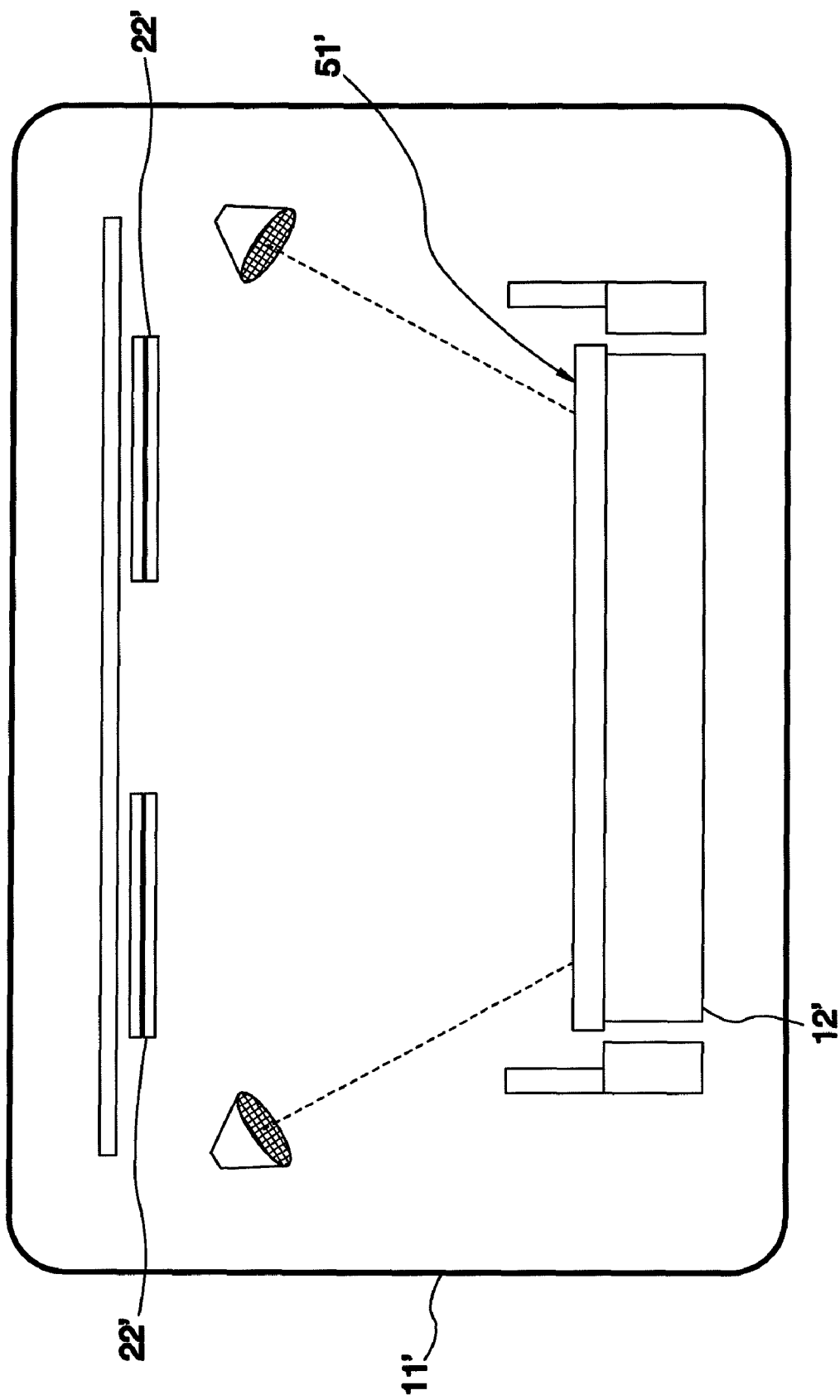
FIG. 4 is a structural schematic view of the third preferred embodiment of the present invention.

Referring to FIG. 2 in view of FIG. 4, an RTP heating method in accordance with a third preferred embodiment of the present invention is to heat a photovoltaic-device intermediate product 51' having a glass substrate 52', a Mo layer 54' coated on the glass subset 52', and a light absorption layer 56' in formation includes the following steps.

a) Preheat the photovoltaic-device intermediate product 51' externally and then send it into the chamber 11' under the condition that the photovoltaic-device intermediate product 51' remains a predetermined temperature, 425° C. in this embodiment. Alternatively, the photovoltaic-device intermediate product 51' can be preheated in another chamber (not shown) before sent to the chamber 11'.

b) Put the photovoltaic-device intermediate product 51' on a support member 12' having good thermal conductivity and high specific heat.

c) Heat an upper surface (i.e. the light absorption layer on the Mo layer 54' in formation) of the photovoltaic-device intermediate product 51' by a heating element 22' and then thermally conduct a lower surface (i.e. the lower surface of the glass substrate 52') of the photovoltaic-device intermediate product 51' through the support member 12' for thermal dissipation. The heating element 22' can generate infrared rays to heat the upper surface of the photovoltaic-device intermediate product 51'. Each of the infrared rays is limited to a predetermined wavelength of 3500-4500 Å, such that most of the infrared rays can be reflected off the Mo layer 54' to decrease direct heating applied to the glass substrate 52' and to mainly heat the light absorption layer 56' in formation. In this way, the upper surface of the photovoltaic-device intermediate product 51' can be heated and the temperature of the Mo layer 54' can rise due to the heating to a certain extent to be transmitted to the glass substrate 52', such that the substrate 52' is heated to raise its temperature. The heat in the glass substrate 52' can be further transmitted to the support member 12' for thermal dissipation to lower the temperature of the substrate 52', such that the lower surface of the glass substrate 52' can keep thermal dissipation and then the temperature of the glass substrate 52' can be lower than the deformation temperature.

In the third embodiment, in the step c), the upper surface of the photovoltaic-device intermediate product 51' is heated up to 500° C. and higher and the lower surface of the photovoltaic-device intermediate product 51' is thermally dissipated down to 500° C. and lower.

The heating method of the third embodiment takes advantages of the characteristic that the Mo layer 54 can reflect the infrared rays to isolate and prevent most of the infrared rays from directly heating the glass substrate 52 to further heat the upper surface of the photovoltaic-device intermediate product 51' other than the lower surface directly. Besides, the heat of the lower surface can be dissipated through the support member, such that it will not happen that the glass substrate 52' is softened and deformed.

In conclusion, the present invention includes the following advantages and effects.

1. The heating of different temperatures can be applied to the upper and lower surfaces of the photovoltaic-device intermediate product to allow the temperature of the upper surface to meet the requirement for production of the light absorption layer and prevent the heat of the lower surface from softening and deforming the glass substrate. In this way, the light absorption layer can be produced on the glass substrate.

2. Under the condition that the glass substrate is not softened and deformed, the light absorption layer can be produced on the glass substrate.

Although the present invention has been described with respect to specific preferred embodiments thereof, it is in no way limited to the specifics of the illustrated structures but changes and modifications may be made within the scope of the appended claims.

What is claimed is:

1. An RTP heating system for heating a photovoltaic-device intermediate product having a glass substrate, a Mo layer coated on the glass substrate, and a light absorption layer in formation, comprising:
    a chamber for receiving the photovoltaic-device intermediate product internally;
    a support member having good thermal conductivity and high specific heat and located in a lower side of the chamber for supporting the photovoltaic-device intermediate product and thermally conducting a lower surface of the photovoltaic-device intermediate product;
    at least one heating element mounted above the chamber for emitting infrared rays of a predetermined wavelength downwardly to heat an upper surface of the photovoltaic-device intermediate product, the Mo layer reflecting most of the infrared rays so that the glass substrate is heated less and the light absorption layer is heated more wherein each of the infrared rays emitted by the at least one heating element has a wavelength of 3500-4500 A;
    a plurality of temperature sensors mounted in the chamber for sensing separately the temperatures of the upper and lower surfaces of the photovoltaic-device intermediate product; and
    a temperature control device connected with the temperature sensors, the at least one heating element, and the support member for controlling at least one thermal source from the heating element and the support member.

2. The RTP heating system as defined in claim 1, wherein the support member comprises a lower thermal source to be applied to a surface of the support member for heating the lower surface of the photovoltaic-device intermediate product.

3. The RTP heating system as defined in claim 1, wherein the surface of the support member falls within the lower surface of the photovoltaic-device intermediate product.

4. The RTP heating system as defined in claim 1 further comprising a strut of low thermal conductivity for covering the support member to prevent the support member from irradiation.

5. The RTP heating system as defined in claim 1, wherein the temperature of the upper surface of the photovoltaic-device intermediate product is higher than that of the lower surface thereof while the at least one heating element heats the photovoltaic-device intermediate product.

6. The RTP heating system as defined in claim 5, wherein the upper surface of the photovoltaic-device intermediate product is heated up to 500° C. and higher and the lower surface thereof is heated up to 425° C. and higher.

7. The RTP heating system as defined in claim 1, wherein the reflected part of the infrared rays are more than 80%.

8. An RTP heating method for heating a photovoltaic-device intermediate product having a glass substrate, a Mo layer coated on the glass substrate, and a light absorption layer in formation, comprising steps of:
    a) putting the photovoltaic-device intermediate product on a support member;
    b) heating an upper surface of the photovoltaic-device intermediate product by a heating element and heating a lower surface of the photovoltaic-device intermediate product through the support member, the heating element generating infrared rays of a predetermined wavelength to heat the upper surface of the photovoltaic-device intermediate product, the Mo layer reflects most of the infrared rays so that the glass substrate is heated less and the light absorption layer is heated more; therefore, the heating degree can be controlled to make a first temperature of the upper surface of the photovoltaic-device intermediate product be higher than a deformation temperature at which the glass substrate deforms and makes a second temperature of the lower surface thereof be lower than the deformation temperature.

9. The RTP heating method as defined in claim 8, wherein the predetermined wavelength of the infrared ray is 3500-4500 Å.

10. The RTP heating method as defined in claim 8, wherein the first temperature of the upper surface of the photovoltaic-device intermediate product in the step b) is 500° C. and higher and the second temperature of the lower surface thereof is 425° C. and higher.

11. An RTP heating method for heating a photovoltaic-device intermediate product having a glass substrate, a Mo layer coated on the glass substrate, and a light absorption layer in formation, comprising steps of:
  a) preheating the photovoltaic-device intermediate product externally and then sending it into a chamber under the condition that the photovoltaic-device intermediate product remains at a first predetermined temperature;
  b) putting the photovoltaic-device intermediate product on a support member having good thermal conductivity and high specific heat; and
  c) heating an upper surface of the photovoltaic-device intermediate product by a heating element and then thermally conducting a lower surface of the photovoltaic-device intermediate product through the support member for thermal dissipation, the heating element generating infrared rays of a predetermined wavelength to heat the upper surface of the photovoltaic-device intermediate product, the Mo layer reflecting most of the infrared rays so that the glass substrate is heated less and the light absorption layer is heated more; therefore, the upper surface of the photovoltaic-device intermediate product can be heated and the heat of the photovoltaic-device intermediate product can be transmitted to the support member for thermal dissipation to further make a second temperature of the lower surface of the photovoltaic-device intermediate product be lower than a deformation temperature at which the glass substrate deforms.

12. The RTP heating method as defined in claim 11, wherein the predetermined wavelength of the infrared ray is 3500-4500 Å.

13. The RTP heating method as defined in claim 11, wherein the upper surface of the photovoltaic-device intermediate product in the step c) is heated up to 500° C. and higher, and the lower surface of the photovoltaic-device intermediate product is thermally dissipated through the support member to let the second temperature be lower than 500° C.

14. The RTP heating method as defined in claim 11, wherein the first temperature of the photovoltaic-device intermediate product in the step a) is 425° C.

* * * * *